United States Patent
Raberg et al.

(10) Patent No.: US 9,570,099 B2
(45) Date of Patent: Feb. 14, 2017

(54) MAGNETORESISTIVE DEVICES AND METHODS FOR MANUFACTURING MAGNETORESISTIVE DEVICES

(71) Applicant: Infineon Technologies AG, Neubiberg (DE)

(72) Inventors: Wolfgang Raberg, Sauerlach (DE); Andreas Strasser, Regensburg (DE); Hermann Wendt, Regensburg (DE); Klemens Pruegl, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/717,213

(22) Filed: May 20, 2015

(65) Prior Publication Data
US 2016/0343392 A1    Nov. 24, 2016

(51) Int. Cl.
*B44C 1/22*  (2006.01)
*G11B 5/39* (2006.01)

(52) U.S. Cl.
CPC .................................. *G11B 5/3903* (2013.01)

(58) Field of Classification Search
CPC .......... G11B 5/3903; G11B 5/39; G11B 5/329
USPC ..... 216/22, 37, 67, 83; 360/319, 320, 324.1, 360/324.12
See application file for complete search history.

(56) References Cited

U.S. PATENT DOCUMENTS

| | | | |
|---|---|---|---|
| 7,183,120 B2* | 2/2007 | Berg ...................... | B82Y 10/00 257/E21.208 |
| 9,064,507 B1* | 6/2015 | Pakala ................. | G11B 5/3163 |

* cited by examiner

*Primary Examiner* — Duy Deo
*Assistant Examiner* — Maki Angadi
(74) *Attorney, Agent, or Firm* — Schiff Hardin LLP

(57) ABSTRACT

A magnetoresistive device that can include a magnetoresistive stack and an etch-stop layer (ESL) disposed on the magnetoresistive stack. A method of manufacturing the magnetoresistive device can include: depositing the magnetoresistive stack, the ESL and a mask layer on a substrate; performing a first etching process to etch a portion of the mask layer to expose a portion of the ESL; and performing a second etching process to etch the exposed portion of the ESL and a portion of the magnetoresistive stack. The method can further include depositing a photoresist layer on the hard mask before the first etching process and removing the photoresist layer from the hard mask following the first etching process. The first and second etching processes can be different. For example, the first etching process can be a reactive etching process and the second etching process can be a non-reactive etching process.

23 Claims, 3 Drawing Sheets

MAGNETORESISTIVE DEVICES AND METHODS FOR MANUFACTURING MAGNETORESISTIVE DEVICES

BACKGROUND

Field

Embodiments described herein generally relate to magnetoresistive devices and methods for manufacturing the same, including magnetoresistive sensors and methods of manufacturing such sensors.

Related Art

Magnetoresistive devices may be based on one or more magnetoresistive technologie—including, for example, tunnel magnetoresistive (TMR), giant magnetoresistive (GMR), anisotropic magnetoresistive (AMR), and/or one or more other magnetoresistive technologies as would be understood by those skilled in the relevant art(s)—that may collectively be referred to as xMR technologies. The magnetoresistive technologies can be configured using various electrical contact configurations, for example, a current in plane (CIP) configuration or a current perpendicular to plane (CPP) configuration. In the CIP configuration, current flows parallel to the layer system of the magnetoresistive device between electrical contacts disposed on a same side of the device, whereas in the CPP configuration, current flows perpendicular to the layer system between electrical contacts disposed on opposing sides of the device.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

The exemplary embodiments of the present disclosure will be described with reference to the accompanying drawings. The drawing in which an element first appears is typically indicated by the leftmost digit(s) in the corresponding reference number.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure.

Figure 1B:
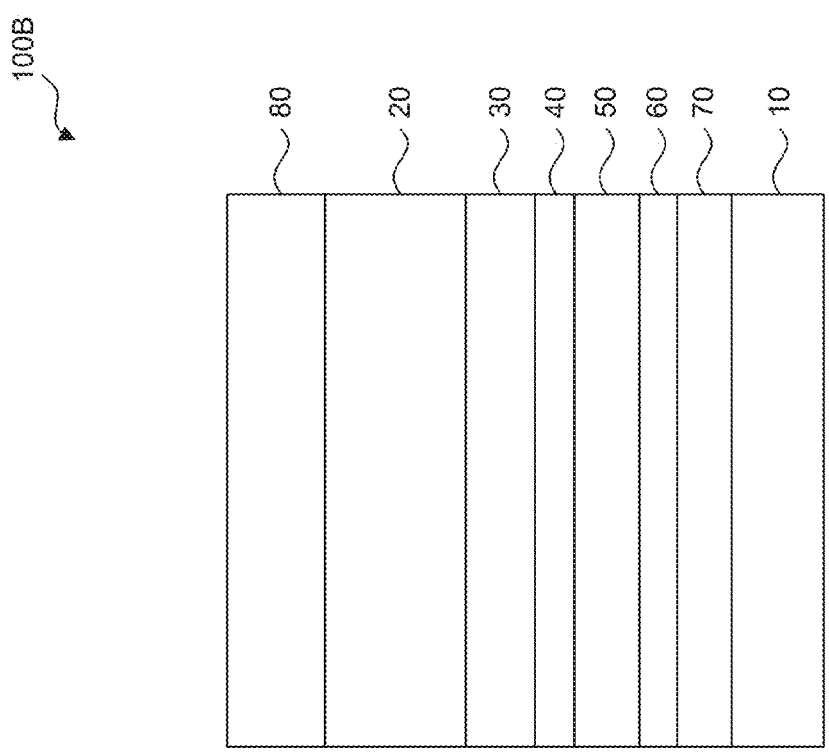
FIGS. 1A and 1B illustrate schematic cross sectional views of a magnetoresistive layer structure according to an exemplary embodiment of the present disclosure.
Figure 1A:
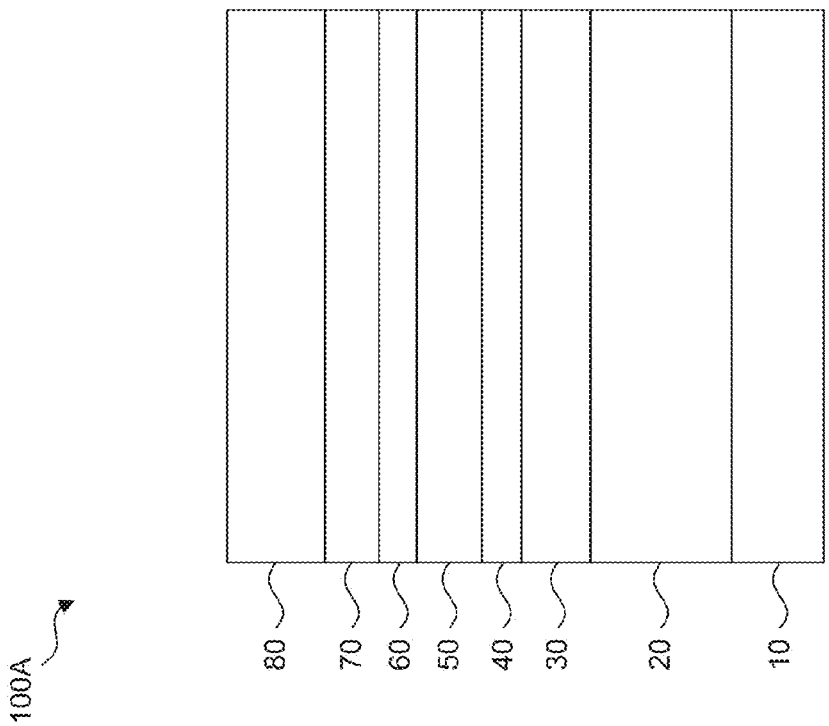

FIGS. 1A and 1B illustrate schematic cross sectional views of magnetoresistive layer structures 100A and 100B, respectively, according to exemplary embodiments of the present disclosure. For the purpose of this disclosure, magnetoresistive layer structure can also be referred to as a "magnetoresistive stack," or an "xMR stack."

FIG. 1A illustrates a schematic cross sectional view of a magnetoresistive layer structure having a bottom spin value (BSV) configuration. In BSV configurations, a free layer 70 is disposed above a pinned layer 30 as illustrated in FIG. 1A. FIG. 1B illustrates a schematic cross sectional view of a magnetoresistive layer structure having a top spin value (TSV) configuration. In TSV configurations, the pinned layer 30 is disposed above the free layer 70 as illustrated in FIG. 1B.

In an exemplary embodiment, the magnetoresistive layer structures 100A and 100B can each include a seed layer 10, an antiferromagnetic layer 20, a pinned layer 30, a coupling layer 40, a reference layer 50, a spacer layer 60, a free layer 70, and a cap layer 80. In another exemplary embodiment, the magnetoresistive layer structure 100A and/or the magnetoresistive layer structure 100B can omit the cap layer 80. For example, the magnetoresistive layer structure 100A and/or the magnetoresistive layer structure 100B can include a seed layer 10, an antiferromagnetic layer 20, a pinned layer 30, a coupling layer 40, a reference layer 50, a spacer layer 60, and a free layer 70.

In the BSV configuration as illustrated in FIG. 1A, the antiferromagnetic layer 20 is disposed on the seed layer 10, the pinned layer 30 is disposed on the antiferromagnetic layer 20, the coupling layer 40 is disposed on the pinned layer 30, the reference layer 50 is disposed on the coupling layer 40, the spacer layer 60 is disposed on the reference layer 50, and the free layer 70 is disposed on the spacer layer 60. In exemplary embodiments that include the cap layer 80, the cap layer 80 is disposed on the free layer 70.

In the TSV configuration as illustrated in FIG. 1B, the free layer 70 is disposed on the seed layer 10, the spacer layer 60 is disposed on the free layer 70, the reference layer 50 is disposed on the spacer layer 60, the coupling layer 40 is disposed on the reference layer 50, and the pinned layer 30 is disposed on the coupling layer 40, the antiferromagnetic layer 20 is disposed on the pinned layer 30. In exemplary embodiments that include the cap layer 80, the cap layer 80 is disposed on the antiferromagnetic layer 20.

In an exemplary embodiment, two or more of the various layers can be parallel or substantially parallel to each other for the TSV and BSV configuration alike. For example, the free layer 70 can be parallel or substantially parallel to the seed layer 10, the spacer layer 60, the reference layer 50, the coupling layer 40, the pinned layer 30, the antiferromagnetic layer 20, and/or the capping layer 80.

The seed layer 10 can include one or more of, for example, Cu, CuN, Ru, Ta, TaN, NiFe, NiCr, NiFeCr, and/or one or more other materials and/or compounds as would be understood by those skilled in the relevant arts. The seed layer 10 can have a thickness of, for example, 5 nm.

The antiferromagnetic layer 20 can include one or more of, for example, PtMn, NiMn, IrMn, and/or one or more other materials and/or compounds as would be understood by those skilled in the relevant arts. The antiferromagnetic layer 20 can have a thickness ranging from, for example, 3 to 50 nm, or a thickness ranging from, for example, 10 to 30 nm. In an exemplary embodiment, the antiferromagnetic layer 20 has a thickness of, for example, 15 nm.

The pinned layer 30 can include one or more of, for example, CoFe, CoFeB, CoFeNi, NiFe, and/or one or more other materials and/or compounds as would be understood by those skilled in the relevant arts. The pinned layer 30 can have a thickness ranging from, for example, 1 to 5 nm, or a thickness ranging from, for example, 2 to 3 nm. In an exemplary embodiment, the pinned layer 30 has a thickness of, for example, 2 nm.

The coupling layer 40 can include one or more of, for example, Ru, Ta, Ti, TiN, Cu, Cr, CuN, and/or one or more other materials and/or compounds as would be understood by those skilled in the relevant arts. The coupling layer 40 can have a thickness ranging from, for example, 0.5 to 3 nm. In an exemplary embodiment, the coupling layer 40 has a thickness of, for example, 1 nm.

The reference layer 50 can include one or more of, for example, CoFe, CoFeB, NiFe, CoFeNi, and/or one or more other materials and/or compounds as would be understood by those skilled in the relevant arts. The reference layer 50 can have a thickness ranging from, for example, 1 to 5 nm, or a thickness ranging from, for example, 2 to 3 nm. In an exemplary embodiment, the reference layer 50 has a thickness of, for example, 2 nm.

The spacer layer 60 can include one or more of, for example, magnesium oxide (MgO), aluminum oxide ($Al_2O_3$), hafnium oxide (HfO) and/or one or more other materials and/or compounds as would be understood by those skilled in the relevant arts. In GMR technologies, the spacer layer 60 can be, for example, copper (Cu) and/or one or more other materials and/or compounds as would be understood by those skilled in the relevant arts. The spacer layer 60 can have a thickness ranging from, for example, 0.5 to 4 nm. In an exemplary embodiment, the spacer layer 60 has a thickness of, for example, 1 nm.

The free layer 70 can include one or more of, for example, CoFe, CoFeB, CoFeNi, NiFe, a combination of one or more of these layers—such as, for example, CoFe/Ru/NiFe—and/or one or more other materials and/or compounds as would be understood by those skilled in the relevant arts. The free layer 70 can have a thickness ranging from, for example, 1 to 5 nm, or a thickness ranging from, for example, 2 to 3 nm. In an exemplary embodiment, the free layer 70 has a thickness of, for example, 3 nm.

The cap layer 80 can include one or more of, for example, Ru, Ta, TaN, and/or one or more other materials and/or compounds as would be understood by those skilled in the relevant arts. The cap layer 80 can have a thickness ranging from, for example, 3-50 nm. In an exemplary embodiment, the cap layer 80 has a thickness of, for example, 5 nm.

The materials and/or compounds of the various layers are not limited to the exemplary materials and/or compounds discussed herein, and one or more of the layers can comprise one or more other compounds and/or materials as would be understood by those skilled in the relevant arts. Similarly, the thicknesses and thickness ranges of the various layers are not limited to the exemplary thickness values discussed herein, and one or more of the layers can have a different thickness as would be understood by those skilled in the relevant arts.

FIGS. 2A-2D schematically illustrate a cross-sectional view of a method 200 for manufacturing a magnetoresistive device in accordance with an exemplary embodiment of the present disclosure.

Figure 2A:
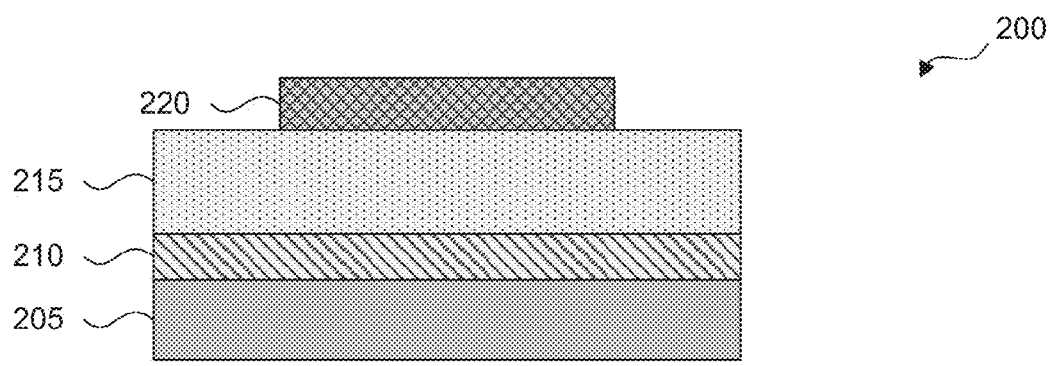
FIGS. 2A-2D illustrate cross-sectional views of a method for manufacturing a magnetoresistive device according to an exemplary embodiment of the present disclosure.

In FIG. 2A, a substrate 205 is provided. The substrate 205 may include or be made of an electrically insulating material, including, for example silicon oxide ($SiO_2$), silicon nitride ($Si_3N_4$), and/or one or more other materials and/or compounds as would be understood by one of ordinary skill in the relevant arts. In other embodiments, the substrate 205 may include or be made of a dielectric material.

With continued reference to FIG. 2A, a magnetoresistive layer structure 210 is provided and disposed on the substrate 205, a hard mask 215 is provided and disposed on the magnetoresistive layer structure 210, and a photoresist 220 is provided and disposed on the hard mask 215. In some examples, the magnetoresistive layer structure 100A or the magnetoresistive layer structure 100B can be an embodiment of the magnetoresistive layer structure 210.

The magnetoresistive layer structure 210 and/or the hard mask 215 can be deposited using one or more deposition processes, including, for example, physical vapor deposition (PVD), chemical vapor deposition (CVD), and/or one or more other deposition processes as would be understood by one of ordinary skill in the relevant arts.

Figure 2B:
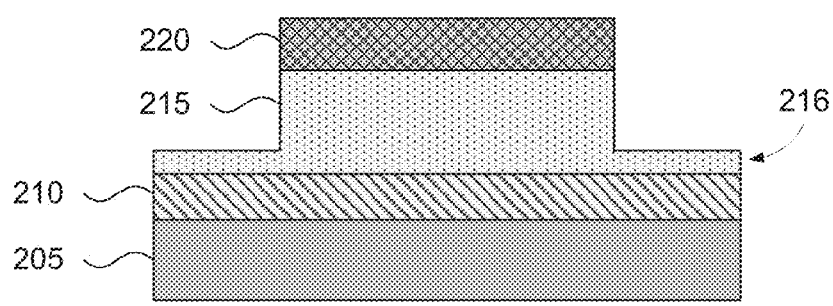

In FIG. 2B, a portion of the hard mask 215 is removed. In an exemplary embodiment, the portion of the hard mask 215 can be removed using one or more etching processes, including, for example, reactive-ion etching (RIE), deep RIE, ion beam etching, one or more other plasma etching processes, one or more chemical etching processes, and/or one or more other etching processes as would be understood by one of ordinary skill in the relevant arts. In some examples, the removal/etching process is stopped before exposing the magnetoresistive layer structure 210, thereby leaving a portion 216 of the hard mask 215 on top of the magnetoresistive layer structure 210. By leaving the portion 216 of the hard mask 215 in place, the magnetoresistive layer structure 210 is not exposed to the removal/etching process. Consequently, the magnetoresistive layer structure 210 can be protected from, for example, corrosion, other destructive reactions, and/or impurities that may be introduced/caused by the removal/etching processing.

Figure 2C:
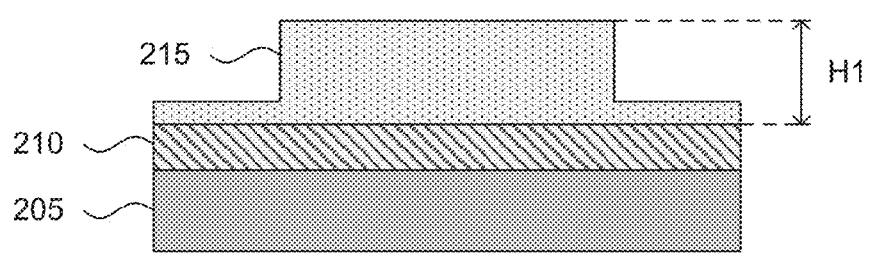

FIG. 2C illustrates a formation of the magnetoresistive device following the removal of the photoresist 220. In this example, the photoresist 220 has been removed following the removal of the portion of the hard mask 215 as illustrated in FIG. 2B.

Figure 2D:
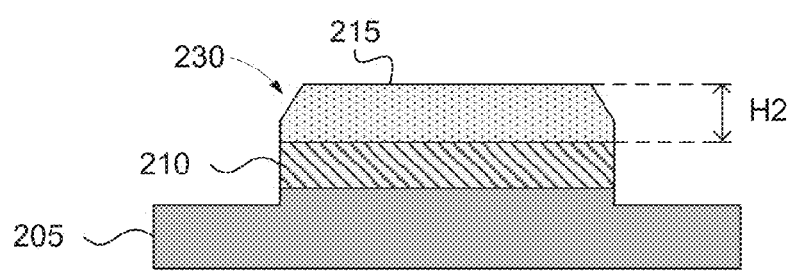

In FIG. 2D, the formation of the magnetoresistive device is subjected to a removal process that can remove one or more of: (1) at least a portion of the hard mask 215 previously protected by the photoresist 220; (2) the portion 216 of the hard mask 215; and (3) the underlying magnetoresistive layer structure 210 (e.g., the portion of the magnetoresistive layer structure 210 under the portion 216). The removal of the underlying magnetoresistive layer structure 210 can expose a portion of the substrate 205. In some examples, at least some of the portion of the substrate 205 exposed during the removal of the underlying magnetoresistive layer structure 210 can also be removed during the removal process.

In an exemplary embodiment, the removal process can include etching processes, including, for example, sputter etching, vapor phase etching, one or more chemical etching processes, and/or one or more other etching processes as would be understood by one of ordinary skill in the relevant arts. In some embodiments the etching process of the hard mask 215 as illustrated in FIG. 2B can be different from the etching process of the hard mask 215, magnetoresistive layer structure 210, and substrate 205 as illustrated in FIG. 2D. For example, the etching process of the hard mask 215 as illustrated in FIG. 2B can be a reactive etching process (e.g., RIE, ion beam etching, etc.) and the etching of the hard mask 215, magnetoresistive layer structure 210, and substrate 205 can be a non-reactive etching process (e.g., sputter etching, vapor phase etching, etc.).

In an exemplary embodiment, the etching of the hard mask 215, magnetoresistive layer structure 210, and the substrate 205 as shown in FIG. 2D can be performed in separate etching processes. However, etching of two or more of the layers can be performed in the same etching process, or the etching of all of these layers can be performed in a single etching process.

Following the removal of the corresponding portions of the hard mask 215 and the magnetoresistive layer structure 210, the magnetoresistive device is formed. In some embodiments, the magnetoresistive device includes the magnetoresistive layer structure 100A or the magnetoresistive layer structure 100B as the magnetoresistive layer structure 210.

In this example, and as illustrated in FIG. 2D, the thickness (H2) of the hard mask 215 has been reduced compared to the thickness (H1) of the hard mask 215 (e.g., in FIG. 2C) before the removal processing in FIG. 2D (i.e., H2<H1). The edges of the hard mask 215 can also be removed creating one or more facets 230. Further, the removal processing in FIG. 2D can result in a portion of the substrate underlying the removed magnetoresistive layer structure 210 to also be removed. In this example, the degree of faceting can be impacted by the amount of hard mask 215 (e.g., portion 216) left following the etching process illustrated in FIG. 2B. For example, as the thickness of the portion 216 increases, the facet(s) 230 caused the by the etching process illustrated in FIG. 2D can also increase. That is, increases in portion 216 can require an increase in the etching process used to remove the remaining hard mark 215 (portion 216) and the underlying magnetoresistive layer structure 210, thereby increasing the facet(s) 230. In some cases, excessive faceting can expose the magnetoresistive layer structure 210 to potentially corrosive or other destructive reactions and/or impurities that may be introduced/caused by the etching of the hard mask 215. Conversely, by removing a greater thickness of the hard mask 210 (e.g., reducing the remaining portion 216), the potential for exposure of the underlying magnetoresistive layer structure 210 to corrosive or other destructive reactions and/or impurities may also increase.

FIGS. 3A-3D schematically illustrate a cross-sectional view of a method 300 for manufacturing a magnetoresistive device in accordance with an exemplary embodiment of the present disclosure.

Figure 3A:
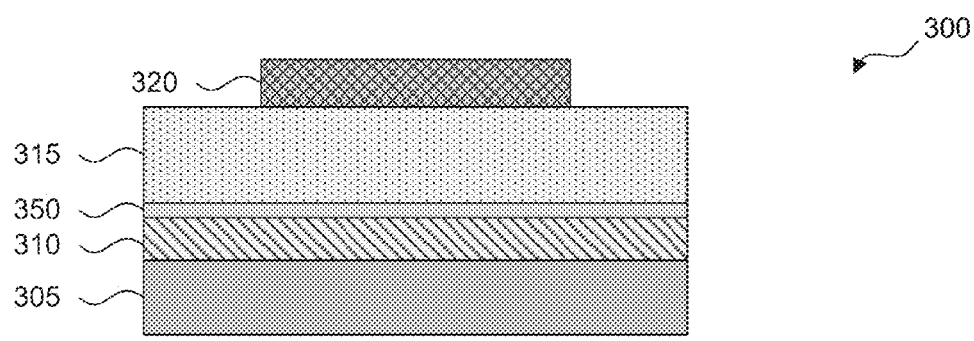
FIGS. 3A-3D illustrate cross-sectional views of a method for manufacturing a magnetoresistive device according to an exemplary embodiment of the present disclosure.

In FIG. 3A, a substrate 305 is provided. The substrate 305 may include or be made of an electrically insulating material, including, for example silicon oxide ($SiO_2$), silicon nitride ($Si_3N_4$), and/or one or more other materials and/or compounds as would be understood by one of ordinary skill in the relevant arts. In other embodiments, the substrate 305 may include or be made of a dielectric material.

With continued reference to FIG. 3A, a magnetoresistive layer structure 310 is provided and disposed on the substrate 305, an etch-stop layer (ESL) 350 is provided and disposed on the magnetoresistive layer structure 310, a hard mask 315 is provided and disposed on the ESL 350, and a photoresist 320 is provided and disposed on the hard mask 315. In some examples, the magnetoresistive layer structure 100A or the magnetoresistive layer structure 100B can be an embodiment of the magnetoresistive layer structure 310.

In an exemplary embodiment, the ESL 350 can include or be made of, for example, magnesium oxide (MgO), aluminum oxide ($Al_2O_3$), aluminum nitride (AlN), titanium oxide ($TiO_2$), zirconium oxide ($ZrO_2$), hafnium oxide ($HfO_2$), and/or one or more other materials and/or compounds as would be understood by one of ordinary skill in the relevant arts. In other embodiments, the ESL 350 can include or be made of, for example, copper (Cu), aluminum (Al), and/or one or more other materials and/or compounds as would be understood by one of ordinary skill in the relevant arts. For example, in TMR technologies, the ESL 350 can be metallic and include or be made of Cu, Al, etc. In GMR technologies, the ESL 350 can include or be made of one or more of MgO, $Al_2O_3$, AlN, $TiO_2$, $ZrO_2$, $HfO_2$, etc.

The composition of the ESL 350 can be selected such that the ESL 350 is resistant to one type of removal process while being less resistant to another removal process. For example, the ESL 350 can be configured to have a high resistance to, for example, reactive etching processes (e.g., reactive ion etching (RIE), ion beam etching, etc.) while having a low resistance to non-reactive etching processes (e.g., sputter etching, vapor phase etching, etc.). In some embodiments, the ESL 350 can have a lower resistance to removal/etching processes than the hard mask 315.

The ESL 350 can have a thickness of, for example, 1-5 nm, 2-4 nm, 1-3 nm, 2-3 nm, and/or another thickness as would be understood by one of ordinary skill in the relevant arts. In comparison, the hard mask 315 can have a thickness of, for example, 100-300 nm and the magnetoresistive layer structure 310 can have a thickness of, for example, 50 nm. That is, in one or more embodiments, the hard mask 315 and the magnetoresistive layer structure 310 can have thicknesses that are at least, for example, 10 times greater than the thickness of the ESL 350.

In an exemplary embodiment, ESL 350 is disposed on, for example, the cap layer 80 of the magnetoresistive layer structure 100A or the magnetoresistive layer structure 100B. In other embodiments, the ESL 350 can be disposed between the cap layer 80 and the underlying free layer 70/antiferromagnetic layer 20 in the magnetoresistive layer structures 100A, 100B. In other embodiments, the magnetoresistive layer structure 100A or the magnetoresistive layer structure 100B can omit the cap layer 80, and the ESL 350 can be disposed on the free layer 70 or the antiferromagnetic layer 20, respectively. In this example, the ESL 350 can function as the cap layer 80 in addition to functioning as an etch-stop layer.

The magnetoresistive layer structure 310, ESL 350, and/or the hard mask 315 can be deposited using one or more deposition processes, including, for example, physical vapor deposition (PVD), chemical vapor deposition (CVD), and/or one or more other deposition processes as would be understood by one of ordinary skill in the relevant arts.

Figure 3B:
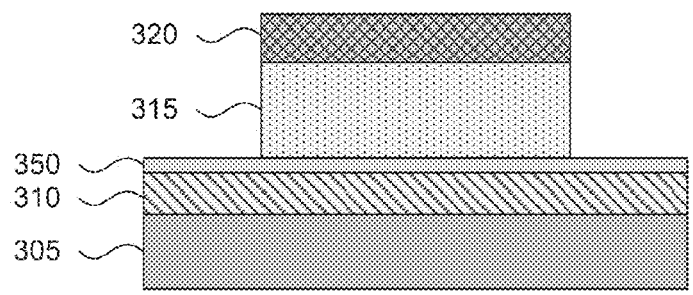

In FIG. 3B, a portion of the hard mask 315 is removed to expose an underlying portion of the ESL 350. In this example, the entire thickness of the hard mask 315 can be removed, which differs from the removal process illustrated in FIG. 2B where a portion 216 of the hard mask 215 is not removed. In this example, the inclusion of the ESL 350 allows for the removal of the entire thickness of the hard mask 315 while protecting the magnetoresistive layer structure 310 from the removal process. For example, the magnetoresistive layer structure 310 can be protected from, for example, corrosion, other destructive reactions, and/or impurities that may be introduced/caused by the removal/etching processing.

In an exemplary embodiment, the portion of the hard mask 315 can be removed using one or more etching processes, including, for example, reactive-ion etching (RIE), deep RIE, ion beam etching one or more other plasma etching processes, one or more chemical etching processes, and/or one or more other etching processes as would be understood by one of ordinary skill in the relevant arts.

Figure 3C:
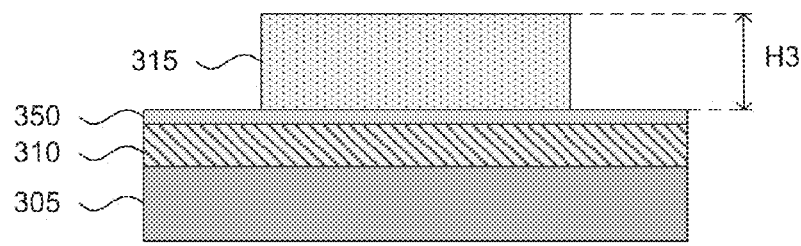

FIG. 3C illustrates the formation of the magnetoresistive device following the completion of the removal of the portion of the hard mask 315. In this example, the photoresist 320 has also been removed following the removal of the portion of the hard mask 315.

Figure 3D:
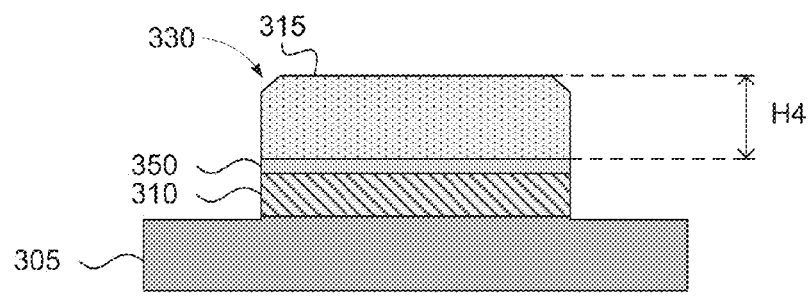

In FIG. 3D, the formation of the magnetoresistive device is subjected to a removal process that can remove one or more of: (1) at least a portion of the hard mask 315 previously protected by the photoresist 320; (2) the ESL 350; and (3) the underlying magnetoresistive layer structure 310. The removal of the ESL 350 and the underlying magnetoresistive layer structure 310 can expose a portion of the substrate 305. In some examples, at least some of the portion of the substrate 305 exposed during the removal of the underlying magnetoresistive layer structure 310 can also be removed during the removal process.

By including the ESL 350 that includes a smaller thickness than a remaining hard mask portion (e.g., 216 in FIG. 2B) and/or has a reduced resistance to removal/etching processes than the hard mask 315, the extent of the removal processing illustrated in FIG. 3D can be reduced when compared to the similar removal processing illustrated in FIG. 2D. For example, the removal processing illustrated in FIG. 3D can be implemented for a shorter time period and/or at a reduced intensity than the removal processing illustrated in FIG. 2D.

In an exemplary embodiment, the removal process can include one or more etching processes, including, for example, sputter etching, vapor phase etching, one or more chemical etching processes, and/or one or more other etching processes as would be understood by one of ordinary skill in the relevant arts. In some embodiments, the etching process of the hard mask 315 as illustrated in FIG. 3B can be different from the etching process of the etching of the ESL 350, magnetoresistive layer structure 310, and substrate 305 as illustrated in FIG. 3D. For example, the etching process of the hard mask 315 as illustrated in FIG. 3B can be a reactive etching process (e.g., RIE, ion beam etching, etc.) and the etching of the ESL 350, magnetoresistive layer structure 310, and substrate 305 can be a non-reactive etching process (e.g., sputter etching, vapor phase etching, etc.).

In an exemplary embodiment, the etching of the hard mask 315, magnetoresistive layer structure 310, the ESL 350, and the substrate 305 as shown in FIG. 3D can be performed in separate etching processes. However, etching of two or more of the layers can be performed in the same etching process, or the etching of all of these layers can be performed in a single etching process.

Following the removal of the ESL 350 and the magnetoresistive layer structure 310, the magnetoresistive device is formed. In some embodiments, the magnetoresistive device includes the magnetoresistive layer structure 100A or the magnetoresistive layer structure 100B as the magnetoresistive layer structure 310.

In this example, and as illustrated in FIG. 3D, the removal processing reduces the thickness (H3) of the hard mask 315 to a thickness (H4) of the hard mask 315. However, because the extent of the removal processing illustrated in FIG. 3D can be reduced compared with the similar processing illustrated in FIG. 2D as a result of the included ESL 350, the thickness (H4) of the remaining hard mask 315 is larger than the thickness (H2) of the hard mask 215 illustrated in FIG. 2D. That is, because the removal processing illustrated in FIG. 3B removes the entire thickness of the hard mask 315 and exposes the ESL 350, and because the ESL 350 can be configured to have a smaller thickness (e.g., of portion 216) and/or a lower resistance to removal processing than the hard mask 215/315, the extent of the subsequent removal processing (e.g., FIG. 3D) used to remove the magnetoresistive layer structure 310 can be less than the similar removal processing illustrated in FIG. 2D.

As a result, more of the hard mask 315 remains and forms a part of the magnetoresistive device than that of the corresponding hard mask 215 illustrated in FIG. 2D. That is, the thickness (H4) of the hard mask 315 is larger than the thickness (H2) of the corresponding hard mask 215 illustrated in FIG. 2D. Further, the edges of the hard mask 315 can also be removed creating one or more facets 330. However, as illustrated in FIG. 3D, the facets 330 can be smaller than the facets 230 of the embodiment illustrated in FIG. 2D due to the reduction in removal processing used in the formation of the magnetoresistive device illustrated in FIG. 3D. In this example, the inclusion of the ESL 350 can allow for the complete removal of the hard mask 315 as illustrated in FIG. 3B while reducing and/or eliminating exposure of the underlying magnetoresistive layer structure 310 to potentially corrosive or other destructive reactions and/or impurities that may be introduced/caused by the etching of the hard mask 315. Further, by completely removing the portion(s) of the hard mask 315 as shown in FIG. 3B, the resulting facets 330 can be reduced because of the reduction in the subsequent etching processes used to remove the ESL 350 and underlying magnetoresistive layer structure 310 as shown in FIG. 3D.

CONCLUSION

The aforementioned description of the specific embodiments will so fully reveal the general nature of the disclosure that others can, by applying knowledge within the skill of the art, readily modify and/or adapt for various applications such specific embodiments, without undue experimentation, and without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

The present disclosure has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

What is claimed is:

1. A method for manufacturing a magnetoresistive device, the method comprising:
   depositing a magnetoresistive stack, an etch-stop layer (ESL), and a mask layer on a substrate;
   performing a first etching process to etch a portion of the mask layer to expose a portion of the ESL; and
   performing a second etching process to etch the exposed portion of the ESL and a portion of the magnetoresistive stack.

2. The method for manufacturing the magnetoresistive device of claim 1, further comprising:
   depositing a photoresist layer on the mask layer, the photoresist layer exposing the portion of the mask layer.

3. The method for manufacturing the magnetoresistive device of claim 2, further comprising:
   removing the photoresist layer from the mask layer following the first etching process.

4. The method for manufacturing the magnetoresistive device of claim 1, wherein the depositing the magnetoresistive stack, the ESL, and the mask layer comprises:
   depositing the magnetoresistive stack on the substrate;
   depositing the ESL on the magnetoresistive stack; and
   depositing the mask layer on the ESL.

5. The method for manufacturing the magnetoresistive device of claim 1, wherein the ESL is resistant to the first etching process.

6. The method for manufacturing the magnetoresistive device of claim 1, wherein the second etching process exposes a portion of the substrate underlying the portion of the magnetoresistive stack.

7. The method for manufacturing the magnetoresistive device of claim 1, wherein the first etching process is different from the second etching process.

8. The method for manufacturing the magnetoresistive device of claim 1, wherein the first etching process is a reactive-ion etching process.

9. The method for manufacturing the magnetoresistive device of claim 1, wherein performing the second etching process comprises:
   performing an etching process to etch the exposed portion of the ESL; and
   performing another etching process separate from the etching process to etch the portion of the magnetoresistive stack.

10. The method for manufacturing the magnetoresistive device of claim 1, wherein the etching of the exposed portion of the ESL and the portion of the magnetoresistive stack are performed in a single etching process.

11. The method for manufacturing the magnetoresistive device of claim 1, wherein the ESL is formed between the magnetoresistive stack and the mask layer such that the magnetoresistive stack is separated from the mask layer by the ESL.

12. The method for manufacturing the magnetoresistive device of claim 1, wherein the portion of the magnetoresistive stack etched by the second etching process underlies the exposed portion of the ESL etched by the second etching process.

13. The method for manufacturing the magnetoresistive device of claim 1, wherein performing the second etching process comprises: etching the exposed portion of the ESL and then etching a portion of the magnetoresistive stack underlying the exposed portion of the ESL.

14. A method for manufacturing a magnetoresistive device, the method comprising:
   depositing a magnetoresistive stack on a substrate;
   depositing an etch-stop layer (ESL) on the magnetoresistive stack;
   depositing a mask layer on the ESL;
   depositing a photoresist layer on the mask layer, the photoresist layer exposing a portion of the mask layer;
   performing a first etching process to etch the exposed portion of the mask layer to expose a portion of the ESL;
   removing the photoresist layer from the mask layer following the first etching process; and
   performing a second etching process to etch the exposed portion of the ESL and a portion of the magnetoresistive stack.

15. The method for manufacturing the magnetoresistive device of claim 14, wherein the ESL is resistant to the first etching process.

16. The method for manufacturing the magnetoresistive device of claim 14, wherein the second etching process exposes a portion of the substrate underlying the portion of the magnetoresistive stack.

17. The method for manufacturing the magnetoresistive device of claim 14, wherein the first etching process is different from the second etching process.

18. The method for manufacturing the magnetoresistive device of claim 14, wherein the first etching process is a reactive etching process.

19. The method for manufacturing the magnetoresistive device of claim 14, wherein performing the second etching process comprises:
   performing an etching process to etch the exposed portion of the ESL; and
   performing another etching process separate from the etching process to etch the portion of the magnetoresistive stack.

20. The method for manufacturing the magnetoresistive device of claim 14, wherein the etching of the exposed portion of the ESL and the portion of the magnetoresistive stack are performed in a single etching process.

21. A method for manufacturing a magnetoresistive device, the method comprising:
   performing a first etching process to etch a portion of a mask layer to expose a portion of an etch-stop layer (ESL); and
   performing a second etching process to etch the exposed portion of the ESL and a portion of a magnetoresistive stack underlying the ESL.

22. The method for manufacturing the magnetoresistive device of claim 21, wherein the ESL is resistant to the first etching process.

23. The method for manufacturing the magnetoresistive device of claim 21, wherein the first etching process is a reactive etching process and the second etching process is a non-reactive etching process.

* * * * *